United States Patent [19]

Veehof

[11] Patent Number: 4,605,867
[45] Date of Patent: Aug. 12, 1986

[54] PEAK DETECTOR
[75] Inventor: Johannus C. D. M. Veehof, Enschede, Netherlands
[73] Assignee: U.S. Philips Corporation, New York, N.Y.
[21] Appl. No.: 607,335
[22] Filed: May 4, 1984
[30] Foreign Application Priority Data
  May 6, 1983 [NL] Netherlands ............... 8301602
[51] Int. Cl.⁴ ................ H03K 5/153; G01R 19/04
[52] U.S. Cl. ................................ 307/351; 307/359
[58] Field of Search ............... 307/351, 353, 359; 324/103 P
[56] References Cited
PUBLICATIONS
S. Hayes, "Video Detector Stores Peak for Minutes", Electronics vol. 49, No. 4, Feb. 19, 1976, pp. 112-113.

Primary Examiner—John Zazworsky
Attorney, Agent, or Firm—Robert T. Mayer; Bernard Franzblau

[57] ABSTRACT

A peak detector for measuring peak values of a voltage comprises a voltage comparator circuit (3), a capacitor storage element (5), and a charge and discharge circuit (8, 15) for the capacitor. A transistor (8) is connected in common base arrangement between the comparator device (3) and the capacitor with its base (9) connected to a constant voltage (E1). The reverse base-emitter diode voltage is limited by a diode (13). This reduces the value of capacitor (5) so that, with a moderate charging current from the voltage comparator device, a fast peak detector is obtained which can measure non-recurrent pulses of some volts within nanoseconds in a fairly accurate manner.

19 Claims, 10 Drawing Figures

PEAK DETECTOR

This invention relates to a peak detector comprising a capacitor storage element for storing a voltage value which is a measure of the peak value of an input voltage to be applied to the peak detector, a voltage comparator circuit having a first input for the input voltage, a second input coupled to the capacitor, and an output, and further comprising a transistor which has its collector coupled to the capacitor and has its base-emitter path coupled both to said output and to a voltage source supplying a voltage E1.

Such a peak detector is known from the article by J. Hawke in the magazine "Electronic Engineering" Vol. 49, mid-October 1977, page 23, "Low offset peak detector circuit uses transistors".

This article proposes a transistor circuit comprising a small number of components and having a high gain factor over a large frequency band. For this purpose the voltage comparator circuit comprises a differential amplifier with two transistors in a long-tailed pair arrangement and a current mirror arranged in the collector circuit. The current soure Tr3 constitutes the output of the voltage comparator circuit and is connected in common-emitter arrangement with transistor Tr5 with the emitter resistor R4 being connected to a +15 V power supply source.

The latter transistor forms a charging-current source for the capacitor C1 constituting the storage element and is voltage-driven at its base. The variation of the charge on the capacitor as a function of the time dt during which a current I flows is equal to the product of the capacitance value C and the capacitor-voltage variation dU:

$$I \cdot dt = C \cdot dU \quad (1)$$

Or:

$$Du/dt = I/C \quad (2)$$

If it is required to measure the peak values of voltages of moderate amplitude and very high frequency, this means that dU/dt will be very large. This is also the case when a very steep non-recurrent peak voltage is to be measured.

It follows from equation (2) that in the above cases I must be very large in combination with a very small C. A large current may have the drawback that the semiconductor which feeds this current to the capacitor cannot be turned off rapidly due to turn-off delays. A capacitor with a low capacitance presents problems with spurious capacitances, i.e. mainly the internal semiconductor capacitances. For example, in the known circuit the base-collector capacitance of the transistor Tr5 dictates how small the value of the capacitor C1 may be.

It is an object of the invention to improve the known peak detector so as to obtain a very fast peak detector.

A peak detector in accordance with the invention is characterized in that the transistor is operated in common-base arrangement, for which purpose the base is connected to the voltage source and the emitter to said output, and a diode is coupled between the base and the emitter connecting in anti-parallel with the base-emitter diode. Such a peak detector may attain a slew rate of some tenths of a volt per nanosecond and measure a pulse of half a volt within an interval of ten to twenty nanoseconds with an accuracy of substantially one hundred percent.

Since the base of said transistor is at a fixed potential the influence of any cross talk from the base-collector capacitance is eliminated. The diode across the base-emitter diode limits the voltage across this transistor base-emitter diode to approximately 0.4 V, so that the cross talk via the emitter-collector capacitance is very small.

Since a peak detector in accordance with the invention can be extremely suitable for measuring steep non-recurrent pulses of short duration, it is desirable to give it a hold function.

For this purpose an embodiment may comprise a buffer amplifier which has a high-impedance non-inverting input connected to the capacitor so that leakage currents can be minimized. In order to reset the voltage on the capacitor it is now posible to use a high-impedance switching transistor such as a J-FET. In addition, the buffer amplifier may be employed in order to shift the voltgate measurement range.

Said transistor may be of the NPN-type or of the PNP-type, so that in different combinations negative-going peak values or positive-going peak values can be determined by voltage shifts below or above the zero line.

Embodiments of the invention will now be described in more detail, by way of example, with reference to the drawings. In the drawings.

Figure 1:
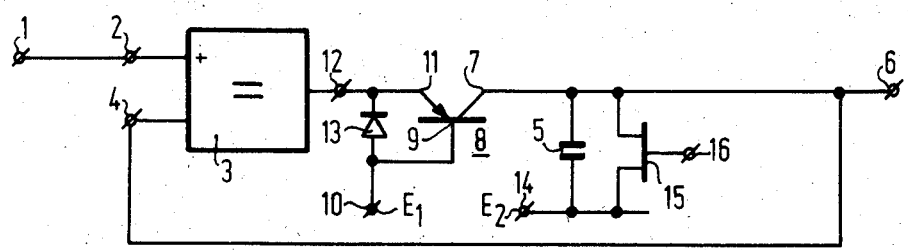
FIG. 1 is a block diagram of a peak detector in accordance with the invention.

The peak detector in accordance with the invention shown in FIG. 1 comprises a transistor 8 connected in common-base arrangement. The varying input signal, whose positive-going or negative-going peak value is to be measured, is applied to the input 1. The input 1 is connected to a first input 2 of a voltage comparator circuit 3, whose second input 4 is connected to a capacitor 5 which is also connected to the output 6 of the peak detector for the measured peak value and to the collector 7 of the transistor 8 whose base 9 is connected to a voltage source producing a fixed voltage E1 at a terminal 10. The emitter 11 is connected to the output 12 of the voltage comparator circuit 3. A diode 13 is arranged in anti-parallel across the base-emitter diode. The capacitor 5 may be connected to ground, but as shown, it may alternatively be connected to terminal 14 to which a voltage source producing a voltage E2 is connected. A switch 15, represented as a FET, can reset the capacitor 5, and consequently the output 6, to a well-defined potential, in the present case to a value E2, in order to prepare for a new peak-value measurement by means of a reset signal applied to input 16.

Figure 2:
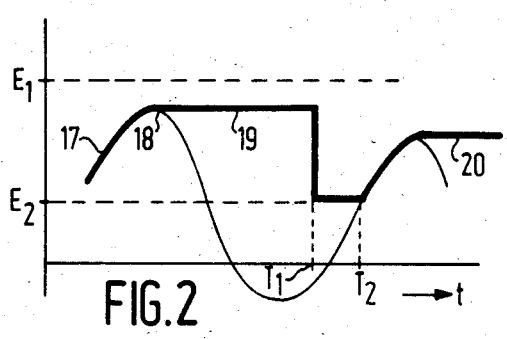
FIG. 2 is a diagram associated with FIG. 1.

The diagram in FIG. 2 illustrates the operation of the peak detector shown in FIG. 1. Transistor 8 is operative only if the output 12 carries a voltage which is some tenths of a volt higher than the value E1 and if, moreover, the voltage at the collector 7 and consequently that on the capacitor 5 is lower than the value E1. This means that the voltage value E2 is substantially lower than the volgage value E1 so that the measurement range for peak values will be situated between E1 and E2, as indicated in FIG. 2. If the input voltage at input 1 and hence that at input 2 increases as indicated by 17, the output 12 of the comparator 3 becomes more positive and transistor 8 is turned on so that capacitor 5 is charged, which gives rise to an increasing voltage at input 4. After the peak 18 the voltage at inputs 1 and 2 decreases and output 12 supplies a decreasing voltage, so that transistor 8 is cut off and diode 13 is turned on to limit the voltage swing on the emitter 11. The capacitor 5 retains its voltage so that the voltage at input 4 and output 6 is constant as a function of time, as indicated by 19 in FIG. 2. At the instant T1 resetting is effected so that at the instant T2 a new measurement begins with a new peak value at 20. A measurement range can be set by selection of E1 and E2. It is obvious that if E2=0 this results in a peak detector which measures positive peak values. Alternatively, E1 may be selected to be zero so that for a negative input signal it is possible to measure the smallest value in an absolute sense, but this value is negative.

Figure 3:
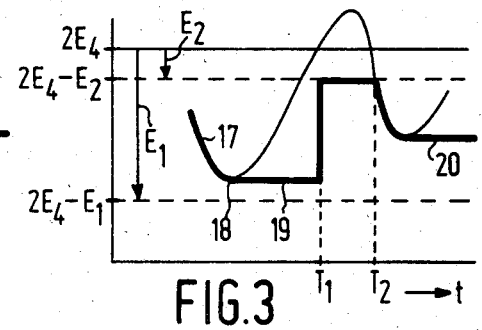
FIG. 3 is a diagram associated with FIG. 4.

FIG. 3 indicates how with a suitable choice of the voltages E1, E2 and E4 negative-going peak values of an input signal can be measured. Again the voltges E2 and E4 may be zero so that the highest negative peak values of an input voltage can be determined.

Figure 4:
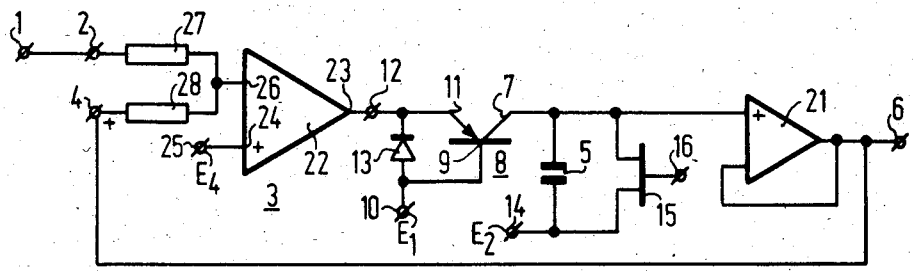
FIG. 4 shows another schematic embodiment.

FIG. 4 shows a circuit arrangement by means of which the diagram of FIG. 3 can be obtained. This peak detector is substantially indentical to that shown in FIG. 1, but now there is provided a buffer amplifier 21 with a gain factor of 1 in order to transfer the voltage across the capacitor 5 to the output 6 and the input 4 substantially without leakage. Moreover, the voltage comparator circuit 3 is shown in more detail, in particular to indicate that a voltage inversion is required in order to measure negative-going peak values. For this purpose there is provided a differential amplifier 22 whose output 23 is connected to the output 12, and whose non-inverting input 24 is connected to a terminal 25 to which a voltage source providing a voltge E4 is connected. The inverting input 26 connected to input 2 via a resistor 27 and to an input 4 via a resistor 28.

The circuit operates as follows. If the voltage at input 1 is negative-going after balancing, input 26 becomes negative relative to input 24 so that ouputs 23 and 12 become positive, transistor 8 is turned on, and the charge on capacitor 5 becomes more positive. The voltage at input 4 increasses, which compensates for the decrease originally occurring at input 26. This means that the circuit follows the negative-going voltage 17 in FIG. 3. At the peak 18 transistor 8 is cut off and the circuit holds the voltage value 19.

Figure 5:
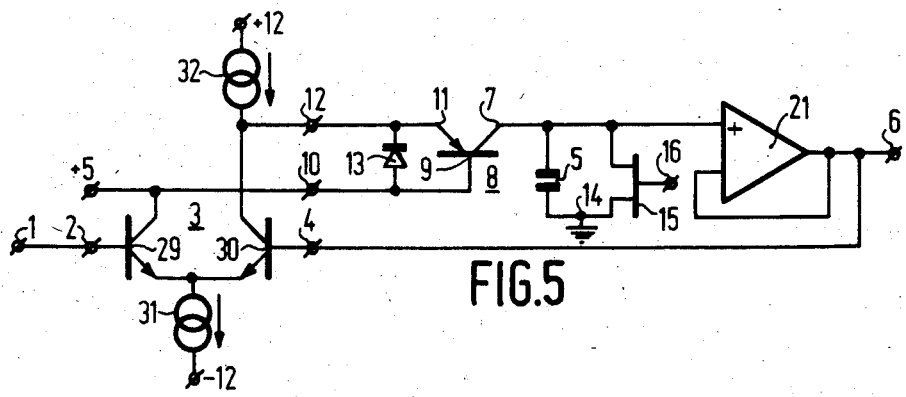
FIG. 5 shows a practical form of a peak detector in accordance with the invention

FIG. 5 shows a modified form of the peak detector of FIG. 1 in more detail. The voltage comparator circuit 3 comprises differential amplifier with transistors 29 and 30 which are emitter-coupled to a current source 31. The collector load impedance of transistor 30 is a current source 32 which provides a high gain factor and which limits the current to transistor 8. The current mirror circuit comprising transistors Tr3 and Tr4 in FIG. 1 of the article mentioned in the introductory part may be used as an alternative if an even higher gain factor but a smaller bandwidth is desired.

Figure 6:
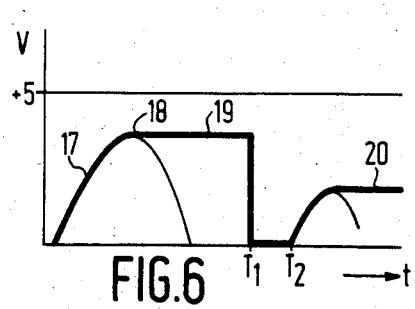
FIG. 6 is a diagram associated with FIG. 5.

FIG. 6 shows the diagram associated with the peak detector of FIG. 5. The circuit measures positive peak values from zero volts to +5 V. The circuit is reset to zero.

So far, transistor 8 was of the PNP-type. It is also possible to form a peak detector which also measures negative-going or positive-going peak values using a transistor of the NPN-type.

Figure 7:
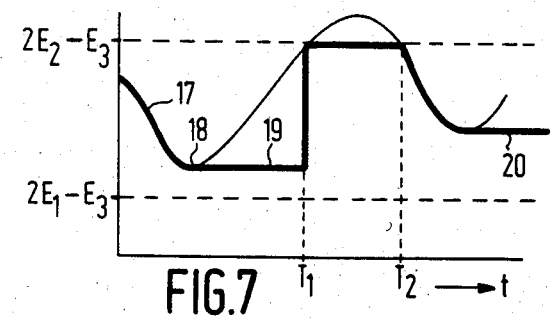
FIG. 7 is a diagram associated with FIG. 8.

FIG. 7 shows a diagram identical to the diagram of FIG. 3 but with different voltage limits of the measurement range.

Figure 8:
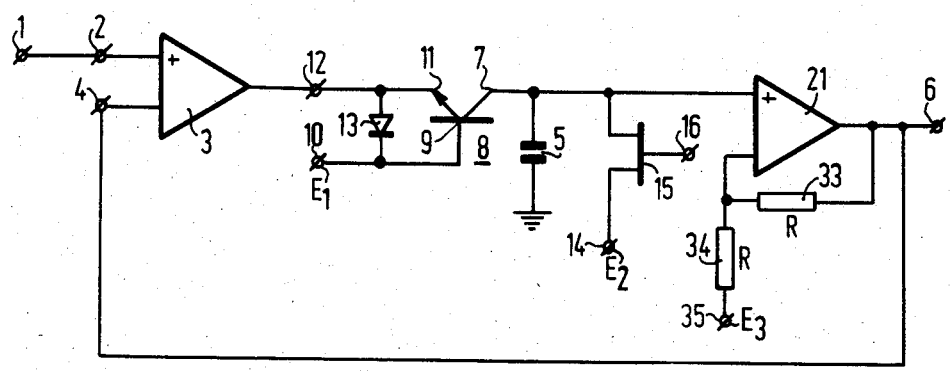
FIG. 8 shows a different embodiment for measuring negative-going peak values.

FIG. 8 shows the circuit arrangement of a peak detector with which the diagram shown in FIG. 7 can be obtained and in which transistor 8 is an NPN transistor. The buffer amplifier 21 is provided with negative feedback by means of resistor 33 connected from the output 6 to the inverting input and resistor 34 connected from a terminal 35, to which a voltage source producing a voltage E3 may be connected, to the inverting input. In this respect it is important to note that the measurement range can be shifted by means of the voltage E3. If the same value R is selected for the resistors 33 and 34, the gain factor of the buffer amplifier will be two for the capacitor voltage and unity for the voltage E3. As is apparent from FIG. 7, it is now possible that E3=2E2, so that resetting to zero is effected and it is possible to measure negative peak voltages having maximum values in an absolute sense.

Figure 9:
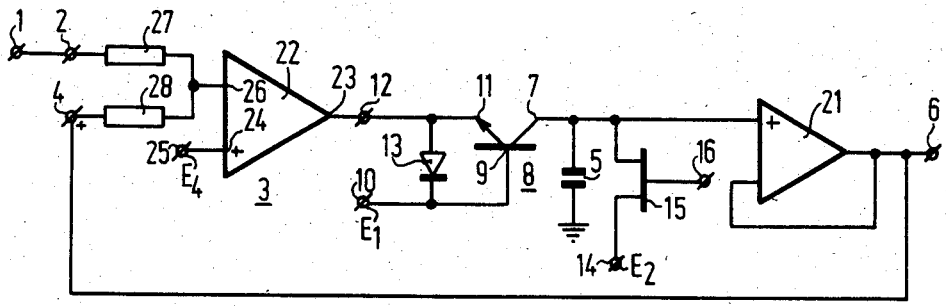
FIG. 9 shows an embodiment for measuring positive-going peak values.
Figure 10:
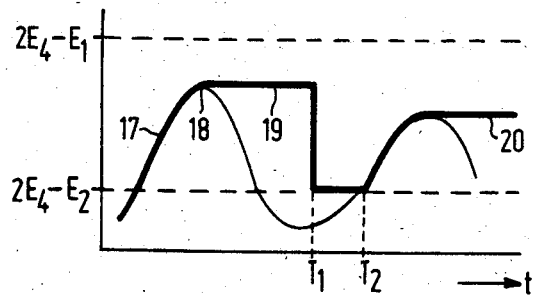
FIG. 10 is a diagram associated with FIG. 9.

FIG. 9 is almost identical to FIG. 4, except that transistor 8 is a NPN transistor and capacitor 5 is connected to ground instead of to terminal 14. As a result of the choice of this transistor the voltage values E1 and E2 are interchanged, as will be apparent from FIG. 3 and FIG. 10. However, a significant difference between these circuit arrangements together with associated diagrams is that the peak detector shown in FIG. 9 measures positive-going peak values, as can be seen in FIG. 10.

What is claimed is:

1. A peak detector comprising a capacitor storage element for storing a voltage value which is a measure of the peak value of an input voltage to be applied to the peak detector, a voltage comparator circuit having a first input for the input voltage, a second input coupled to the capacitor, and an output, a transistor having a collector coupled to the capacitor and a base-emitter path coupled to said comparator circuit output and to a voltage source supplying a fixed voltage E1 with the base of the transistor connected to the voltage source $E_1$ and the emitter to said comparator circuit output so that the transistor is operated in common base arrangement, and a diode connected between the base and the emitter of the transistor in anti-parallel with the base-emitter diode junction.

2. A peak detector as claimed in claim 1 further comprising a buffer amplifier having a high-impedance non-inverting input connected to a first terminal of the capacitor and having an output connected to the second input of the voltage comparator circuit and to the output of the peak detector, and a reset switch connected between said first terminal of the capacitor and a voltage source supplying a fixed voltage E2.

3. A peak detector as claimed in claim 2, characterized in that the gain factor of the buffer amplifier is unity.

4. A peak detector as claimed in claim 2, characterized in that an inverting input of the buffer amplifier is connected to the output of the buffer amplifier via a first resistor and via a second resistor to a voltage source supplying a fixed voltage E3.

5. A peak detector as claimed in claim 2 wherein the transistor is of the PNP-type and the voltage value E1 is higher than the voltage value E2.

6. A peak detector as claimed in claim 2 wherein the transistor is of the NPN-type and the voltage value E1 is smaller than the voltage value E2.

7. A peak detector as claimed in claim 4 wherein the voltage comparator circuit comprises a differential amplifier having an output connected to said comparator circuit output, a non-inverting input connected to a voltage source supplying a fixed voltage E4 and an inverting input connected to an input terminal for the input voltage via a third resistor and to the peak detector output via a fourth resistor.

8. A peak detector as claimed in claim 1 wherein the voltage comparator circuit comprises a differential amplifier having an output terminal connected to said output of the comparator circuit, a non-inverting input connected to a voltage source E4 and an inverting input connected to an input terminal for the input voltage and an output terminal of the peak detector via first and second resistors, respectively.

9. A peak detector comprising: an input terminal for an input voltage, a capacitor for storing a voltage indicative of the peak voltage of an input voltage at the input terminal, a voltage comparator having first and second inputs and an output, means coupling an output terminal of the detector to one terminal of the capacitor, means connecting the input terminal to the first input of the comparator, a transistor connected in common-base configuration with its emitter connected to the output of the comparator, its collector connected to the one terminal of the capacitor and its base connected to a source of reference voltage $E_1$ that is independent of a voltage at the detector output terminal, second means coupling the comparator second input to the detector output terminal whereby the comparator effectively compares the input voltage with the capacitor voltage, and a diode connected in anti-parallel across the base-emitter diode junction of the transistor.

10. A peak detector as claimed in claim 9 further comprising means connecting a second terminal of the capacitor to a source of constant voltage $E_2$, wherein $E_1 \neq E_2$.

11. A peak detector as claimed in claim 10 further comprising an electronic semiconductor switch coupled to said capacitor for periodically discharging the capacitor thereby to rapidly reset the peak detector, and wherein the transistor provides a charge path for the capacitor.

12. A peak detector as claimed in claim 9 wherein the transistor is a PNP transistor and the reference voltage $E_1$ is a constant voltage, and means connecting a second terminal of the capacitor to a source of constant voltage $E_2$, wherein $E_1 > E_2$.

13. A peak detector as claimed in claim 9 wherein the transistor is an NPN transistor and the reference voltage $E_1$ is a constant voltage, and means connecting a second terminal of the capacitor to a source of constant voltage $E_2$, wherein $E_2 > E_1$.

14. A peak detector as claimed in claim 9 wherein the voltage comparator includes a source current coupled to the comparator output so that the capacitor can be charged from said current source via the emitter-collector path of the transistor.

15. A peak detector as claimed in claim 10 wherein the first coupling means comprises a buffer amplifier having a non-inverting input coupled to the one terminal of the capacitor, an output coupled to the peak detector output terminal, and an inverting input coupled to said amplifier output.

16. A peak detector as claimed in claim 15 wherein said amplifier inverting input is coupled to the amplifier output via a first resistor and to a source of constant voltage $E_3$ via a second resistor.

17. A peak detector as claimed in claim 15 wherein the voltage comparator comprises a differential amplifier having an output terminal connected to said output of the voltage comparator, a non-inverting input connected to a source of constant voltage $E_4$, and an inverting input connected to the first input of the voltage comparator via a first resistor and to the second input of the voltage comparator via a second resistor.

18. A peak detector as claimed in claim 9 further comprising means connecting a second terminal for the capacitor to ground, and a semiconductor switching device for discharging the capacitor to reset the peak detector and having one terminal connected to said one terminal of the capacitor and a second terminal connected to a source of constant voltage $E_2$, wherein $E_1 \neq E_2$.

19. A peak detector as claimed in claim 9 wherein the base of the transistor is connected to the reference voltage $E_1$ in a manner so as to electrically isolate said base from a voltage at the peak detector output terminal.

* * * * *